United States Patent [19]

Sinton

[11] Patent Number: 5,053,083
[45] Date of Patent: Oct. 1, 1991

[54] BILEVEL CONTACT SOLAR CELLS

[75] Inventor: Ronald A. Sinton, Palo Alto, Calif.

[73] Assignee: The Board of Trustees of the Leland Stanford Junior University, Stanford, Calif.

[21] Appl. No.: 348,371

[22] Filed: May 8, 1989

[51] Int. Cl.[5] .................. H01L 31/06; H01L 31/18
[52] U.S. Cl. .................. 136/256; 136/255; 437/2; 357/30
[58] Field of Search .............. 136/255, 256; 437/2-5; 357/30 J, 30 Q

[56] References Cited

U.S. PATENT DOCUMENTS

| 4,200,472 | 4/1980 | Chappell et al. | 136/246 |
| 4,361,717 | 11/1982 | Gilmore et al. | 136/246 |
| 4,838,952 | 6/1989 | Dill et al. | 136/256 |

FOREIGN PATENT DOCUMENTS 63-211775  9/1988  Japan ................................ 136/256

OTHER PUBLICATIONS

F. W. Sexton et al., *J. Electrochem. Soc.*, vol. 129, pp. 2624–2628 (1982).
R. A. Sinton et al., *Proc. E. C. Photovoltaic Solar Energy Conf.* (Sep. 1989).
Terry I. Chappell, "The V-Groove Multijunction Solar Cell", *Proc. IEEE Photovoltaic Specialist Conference* (1978), pp. 791–796.
Michael D. Lammert et al., "The Interdigitated Back Contact Solar Cell . . . ", *IEEE Trans. Electron Devices*, vol. ED-24, No. 4, Apr. 1977, pp. 337–342.
P. Verlinder et al., "High Efficiency Interdigitated Back Contact Silicon Solar Cells", *Proc. 19th IEEE Photovoltaic Specialist Conf.*, 1987, pp. 405–410.
R. J. Schwartz, "Review of Silicon Solar Cells for High Concentrations", *Solar Cells*, vol. 6 (1982), pp. 17–38.
"Novel Implementations of Backside-Contact Silicon Solar Cell Designs in One-Sum and Concentrator Applications", R. A. Sinton et al., *Proc. 4th Int. Photovoltaic Conference*, Sydney, Australia, Feb. 14–17, 1989.
"Simplified Backside-Contact Solar Cells", Ronald A. Sinton et al., *IEEE Trans. on Electron Devices*, vol. 37, No. 2, Feb. 1990, pp. 348–352.
"Development Efforts in Silicon Backside-Contact Solar Cells", R. A. Sinton et al., *Proc. of Eighth E. C. Photovoltaic Solar Energy Conf.*, 9–13 May 1988, pp. 1272–1276.

*Primary Examiner*—Aaron Weisstuch
*Attorney, Agent, or Firm*—Gregory O. Garmong

[57] ABSTRACT

A high efficiency back side contact solar cell is fabricated using a self-aligning process that reduces the number of masks and alignments as compared with prior processes. The back surface of the cell is patterned by etching into an array of bilevel, interdigitated mesas and trenches, separated by inclined surfaces. Doping of the back surface region produces laterally alternating and overlapping P and N regions associated with the mesas and trenches. A metalization layer is deposited over the entire back side of the cell. The portions of the metalization on the inclined surfaces are readily removed by etching. Removal of the metalization on the inclines surfaces separates the mesa conductors from the trench conductors, leaving a well defined interdigitated array of positive electrodes and negative electrodes.

14 Claims, 5 Drawing Sheets 5,053,083

BILEVEL CONTACT SOLAR CELLS

BACKGROUND OF THE INVENTION

This invention relates to the fabrication of high efficiency solar cells, and, more particularly, to the reduction of fabrication cost and manufacturing tolerances for such solar cells and devices.

This invention was made with Government support awarded by Sandia National Laboratory under contract 02-7063A. The Government has certain rights in this invention.

Solar energy offers the potential for providing virtually unlimited energy for use by man, if the solar energy can be made available in a useful form. Much attention has been directed to the problem of using the sun's energy to obtain electricity, which can then be utilized through existing networks. One of the several approaches to generating electricity from solar radiation is the direct generation of electricity by photovoltaic converters.

At the heart of a photovoltaic converter is a photovoltaic cell, also sometimes termed a solar cell. The photovoltaic cell includes a semiconductor material having at least one P/N junction therein. Light falling upon the junction produces mobile electrical carriers in the form of electron-hole pairs, which can then be directed to an external electrical circuit. The operation of photovoltaic cells is described more fully in U.S. Pat. No. 4,234,352, whose disclosure is herein incorporated by reference.

The economics of using photovoltaic cells for many common applications is determined by the efficiency of the cell in converting sunlight to electrical energy. If the efficiency is low, large numbers of cells are required to provide the required electrical current, and the cost of the large number of cells may dictate the use of another energy source. By way of example, the presently most attractive material for construction of photovoltaic cells is silicon. The theoretical maximum conversion efficiency for silicon cells is about 36 percent using sunlight. Cells have been constructed having efficiencies of about 28-29 percent in concentrated sunlight, and about 22 percent in unconcentrated sunlight. However, reaching this level of efficiency has required increasingly complex and costly designs for the photovoltaic cells themselves.

At the present time, the most efficient silicon solar cells are produced with all electrical connections on the back side of the cell, so that no portion of the incident sunlight is shaded by connections and so that efficiency-enhancing treatments such as texturizing can be easily applied to the front side of the cell. The fabrication procedures required to produce these cells utilize multiple, usually at least four, masks and a complex alignment approach. The techniques are similar to those used in the microelectronics industry, but can be even more difficult to apply successfully because of the large surface area of the solar cells that must be processed. As a result, the manufacturing yields of operable cells having high efficiencies is typically low, raising the effective cost of the cells. This increased cost of the cells is one significant consideration inhibiting more widespread use of solar cells in power generation.

There is therefore a need for an improved approach to preparation of solar cells, and the cells made using the improved approach. The design of the cells must not be changed so greatly that efficiency is compromised, in order to achieve the reduced fabrication cost. The present invention fulfills this need, and further provides related advantages.

SUMMARY OF THE INVENTION

The present invention provides a high efficiency solar cell that is readily fabricated with high device yields. The number of masks required in fabrication is reduced to one or two, and deposited layers are self aligning. The effective manufacturing cost of the cells is significantly reduced as compared with other high efficiency solar cells. The cells produced by the present approach can incorporate conventional techniques proved to increase operating efficiency, and have achieved efficiencies comparable with the best cells produced by prior techniques, but at reduced cost.

In accordance with the invention, a process for preparing a solar cell comprises the steps of providing a piece of a semiconductor material; forming laterally alternating mesas and trenches on a back face of the semiconductor piece, there being an elevational transition region between each mesa and the adjacent trench; doping the back face of the semiconductor piece so that P/N junctions are formed between the material below the mesas and the material below the trenches; depositing a metalization layer overlying the back face of the semiconductor piece; and removing the portion of the metalization layer deposited upon the transition region between the mesas and trenches without applying a mask to effect the removal.

A solar cell comprises a piece of a semiconductor material having at least one P/N junction therein, the piece including a front face having no electrodes thereon, and a bilevel elevation back face having a P-doped region at a first level interdigitated with an N-doped region at a second level; and a positive electrode contacting the P-doped region and a negative electrode contacting the N-doped region, both electrodes contacting the solar cell on the back face.

A key feature of the solar cell of the invention is the formation of a bilevel surface profile on the back side of the cell. This cell structure may be otherwise described as mesas and trenches, with inclined surfaces between the adjacent mesas and trenches. (As used herein, the term "inclined" surface includes surfaces having a normal that is not coincident with the normal of the back face of the cell, including surfaces that are angled upwardly and outwardly from the trench bottom, surfaces that extend vertically upwardly from the trench bottom, and surfaces that are angled upwardly and inwardly from the trench bottom, forming an undercut region below the mesa.) The regions under the tops of the mesas are doped either P or N, and the regions under the bottoms of the trenches are oppositely doped, producing the required P/N junctions that are illuminated by sunlight entering the semiconductor through the front side. These junctions are effective even though the P-doped regions and N-doped regions partially overlap in some areas in a compensated structure.

The metalization that provides the electrical connections to the P-doped and N-doped regions is applied as a layer, by an acceptable approach such as a sputtered deposition. The metalization is typically aluminum or an aluminum alloy such as aluminum-1 percent silicon. The thickness of the metalization layer on the inclined surfaces is less than that on the mesa tops or trench bottoms, because of the greater area of the inclined surface area to be covered, a phenomenon termed the "cosine" effect, or because of partial shading of the inclined surface.

The metalization layer is etched, but the resulting etched structure is intentionally not uniform. Because of the lesser thickness of the metalization layer on the inclined surface, it is completely etched away before the metalization layer on the tops of the mesas and the bottoms of the trenches is removed. If etching is stopped at that point, a pattern of two sets of interdigitated metalization traces remains. One set runs along and connects the mesa tops, and one set runs along and connects the trench bottoms. These sets of traces then form the external connections to the P-doped and N-doped regions. In a variation of this basic approach, a thin layer of another metal such as titanium may be deposited overlying the aluminum metalization layer. The overlying layer can increase the differences between the etching behavior of the metalization on the inclined surfaces, as compared with that of the mesa tops and trench bottoms.

Thus, in greater detail, a process for preparing a solar cell comprises the steps of providing a piece of a semiconductor material having a front face and a back face; depositing a layer of a mask material onto the back face, the mask material having a first dopant therein; patterning the mask to form a pattern of elongated openings therethrough; transferring the mask pattern to the back face of the piece of semiconductor material to form a pattern of laterally adjacent mesas and trenches in the back face, the mesas and trenches being separated by inclined regions; diffusing first dopant from the mask material into the mesas; removing the mask; depositing a metalization layer onto the back face; and etching the metalization layer by an amount sufficient to remove that portion overlying the inclined regions but not those portions overlying the mesas and the trenches.

The semiconductor material may be initially doped or undoped. If undoped, both the P-type and N-type dopants must be provided. If furnished in the doped condition, as for example an N-doped silicon piece, then only the other dopant need be furnished. The pattern of mesas and trenches is formed using a patterned mask, preferably having the mesa dopant included therein so that the dopant can be driven into the mesa by an appropriate high temperature diffusion treatment. The metalization layer is then deposited over the entire back face, but coverage is reduced or nonexistent in the inclined regions between the mesas and trenches. After etching, the pattern is complete. Efficiency of such a cell may be on the order of about 22 percent in unconcentrated sunlight. Further improved efficiency, up to about 24 percent, may be gained by oxidizing the silicon surface after the first mask is removed, and patterning the silicon dioxide layer by employing a second mask and process. The one-mask and two-mask, self-aligned, approaches of the invention are significantly less complex and expensive to use than the prior approaches requiring at least four masks and great care to achieve alignment of masks during fabrication.

The present approach thus produces a back side contact cell whose front face is unshaded by electrical contacts. The process of the invention is fully compatible with other efficiency-enhancing techniques known in the art, such as texturizing the front surface or applying antireflective coatings to the front surface. The approach of the invention also permits reduced-resistance, greatly simplified back contact connection to the mesas, as the metalization on the raised mesas can be contacted directly to a conductive backing plate.

A further feature of the present invention is the presence of compensated regions where the n+ doped and p+ doped regions overlap. The ability to utilize such overlapping doped regions in a solar cell, without significant loss of capability, is an important advance. In accordance with this aspect of the invention, a solar cell comprises a piece of semiconductor substrate having an n+ doped region and a p+ doped region, wherein the n+ doped region and the p+ doped region overlap spatially to form a compensated region, and wherein the n+ doped region has a concentration of dopant atoms of at least about $10^{18}$ atoms per cubic centimeter and the p+ doped region has a concentration of dopant atoms of at least about $10^{18}$ atoms per cubic centimeter, and wherein the concentration of n+ doped atoms is greater than the concentration of p+ doped atoms. This design may be used in conjunction with the bilevel approach described above, or with conventional cells, in either case contributing to reduced fabrication complexity and reduced effective cost of the cells.

Thus, the present invention provides an important advance in the art of solar cell fabrication. The complexity of fabrication is reduced, improving the yields of devices while retaining their beneficial features. Other features and advantages of the invention will be apparent from the following more detailed description of the preferred embodiments, taken in conjunction with the accompanying drawings, which illustrate, by way of example, the principles of the invention.

DETAILED DESCRIPTION OF THE PREFERRED EMBODIMENT

Figure 1:
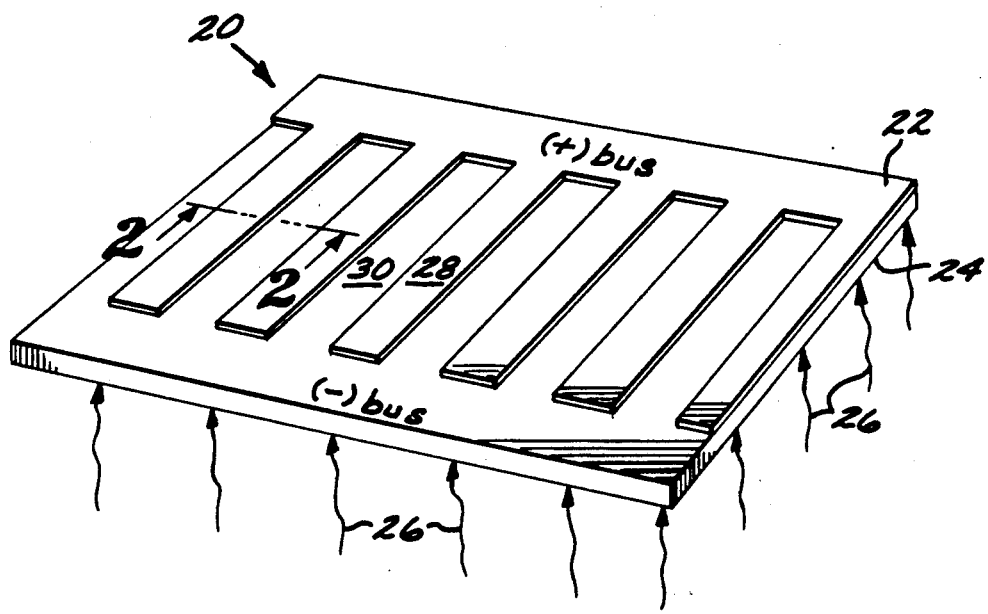
FIG. 1 is a schematic perspective back side view of a solar cell made in accordance with the invention.

FIG. 1 illustrates a preferred form of device, a solar cell 20, made in accordance with the invention. The solar cell 20 of FIG. 1 is viewed from the perspective of a back side 22, having the external electrical connections. By convention in the industry, a front side 24 is the surface of the cell through which sunlight 26 is directed. By placing the electrical connections on the back side 22, the front side 24 is unobstructed by opaque elements that might reduce the amount of sunlight incident upon the cell 20.

The solar cell 20 includes a plurality of back side positive electrodes 28 and a plurality of back side negative electrodes 30. These electrodes connect within the cell 20 to the active positive and negative elements, respectively, and are connected externally to a load or a battery to store the energy produced by the solar cell 20. The electrodes 28 and 30 are "interdigitated", a term of art in the industry meaning that the electrodes are arranged in a generally laterally side by side fashion on the back side 22, so that each of the electrodes 28 and 30 is laterally sandwiched between two electrodes of the opposite type, and extend for some distance in this manner.

Figure 2:
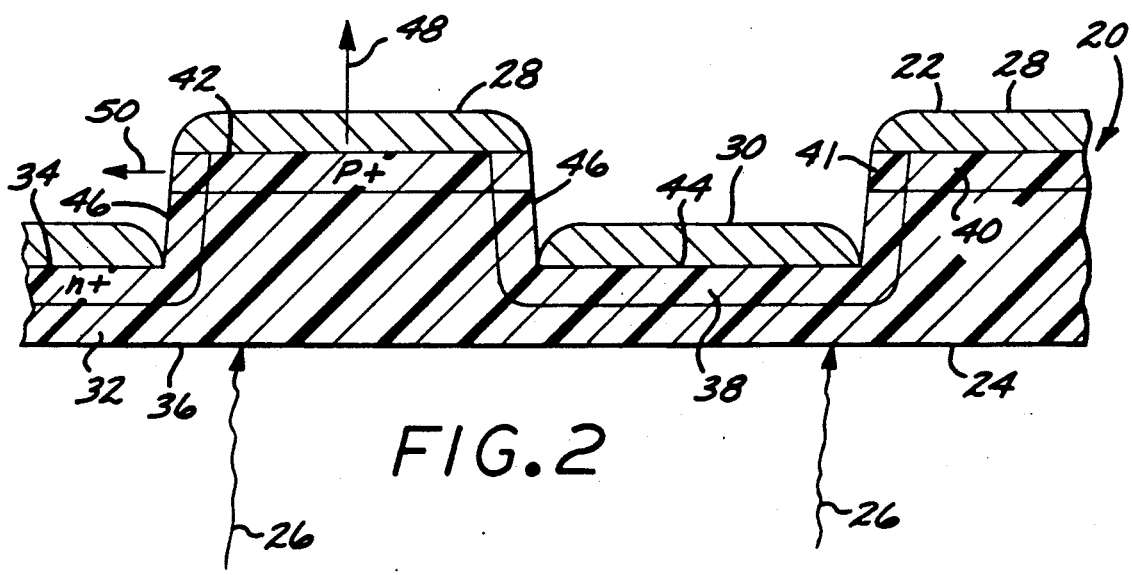
FIG. 2 is a side sectional view of the solar cell of FIG. 1, taken generally along line 2—2.

FIG. 2 illustrates the relationship of the electrodes and the other elements of the solar cell 20 in greater detail. The solar cell 20 includes as a substrate a piece 32 of undoped or doped semiconductor material, which is preferably silicon. The undoped version is illustrated in FIGS. 1 and 2, and the doped version is discussed more fully subsequently. A back surface 34 of the piece 32 corresponds to the back side 22 of the cell, and a front surface 36 of the piece 32 corresponds to the front side 24 of the cell.

The substrate piece 32 includes an n+ doped region 38, and a p+ doped region 40. n+ doping is accomplished with a known type of dopant such as phosphorus for silicon, and p+ doping is accomplished with a known type of dopant such as boron for silicon. A P/N junction 41 is formed within the solar cell where the two doped regions 38 and 40 meet. The positive electrode 28 contacts the p+ doped region 40, and the negative electrode 30 contacts the n+ doped region 38. FIG. 2 shows the laterally side by side, interdigitated arrangement of the electrodes 28 and 30 in a sectional view.

The p+ doped region 40 and its positive electrode 28, and the n+ doped region 38 and its negative electrode 30, are at different elevations (or distances) as measured from the front surface 36. In the view of FIG. 2, the n+ doped region 38 and the negative electrode 30 are at a lower elevation, respectively, than the p+ doped region 40 and the positive electrode 28. This could be reversed, with the n+ doped region and the negative electrode at a higher elevation, respectively, than the p+ doped region and the negative electrode. In the form illustrated in FIG. 2, the p+ doped region 40 and the positive electrode 28 are thus on a mesa 42, while the n+ doped region 38 and the negative electrode 30 are in a trench 44. There is an elevational transition region 46 that is inclined downwardly between the mesa 42 and the trench 44. Alternatively stated, a vector 48 perpendicular to the plane of the substrate piece 32 and its surfaces 34 and 36 is not parallel to a vector 50 perpendicular to the inclined surface of the elevational transition 46.

The solar cell 20 operates by the usual physical principles. Light energy entering the cell through the front surface 36 creates mobile electrical carriers in the neighborhood of the P/N overlap 41, which can be collected through the electrodes 28 and 30 for use in an external circuit. However, the approach of using a bilevel elevation back face for the solar cell permits a significant reduction in complexity in the manufacturing of the solar cell, and also provides the opportunity for an improved external attachment approach.

Permitting the overlap of the p+ and n+ doped silicon in the compensated region 41 significantly simplifies the fabrication of the cell. (A "compensated" region is one where there is doping by both p+ and n+ dopants.) It might be expected that such an overlap of dopants would result in excessive leakage currents or poor emitter saturation currents, both of which could lower the cell voltage. The present invention demonstrates that this design compromise is permitted without excessively detrimental effects on the solar cell efficiency. The bilevel fabrication approach of the invention can be used to manufacture cells that do not have compensated regions, where the p+ and n+ doping overlap, as will be discussed in relation to Example 9, although the fabrication complexity is somewhat increased.

Thus, the use of a self-aligned metalization technique and a dopant configuration in which no attempt is made to avoid a compensated region both contribute to the improved fabricability of the solar cell. These two features may be used independently or in combination, and both result in improvements to the solar cell.

FIGS. 3-5 schematically illustrate the steps involved in manufacturing the solar cell 20, according to several different variations of the bilevel elevation approach. The techniques of FIGS. 3 and 4 require only a single mask, which is self aligned by virtue of the procedure. FIG. 5 illustrates a two-mask approach wherein neither of the masks requires alignment. The solar cell manufactured by the approach of FIG. 5 is therefore slightly more complex to produce, but is found to have a slightly higher efficiency in operation. Both the one-mask and two-mask techniques of FIGS. 3-5 produce solar cells that have operating efficiencies comparable to, or better than, solar cells manufactured by existing processes utilizing four or more masks. The procedure of the present invention, being less complex, and either avoiding or being tolerant of misalignments, results in a higher yield of operable solar cells in large-scale manufacturing operations.

Figure 3A:
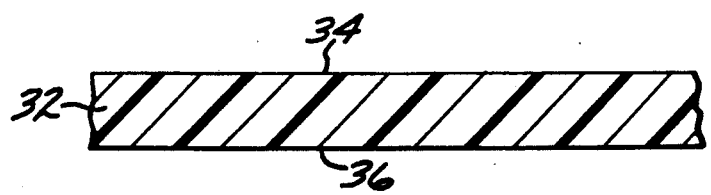
FIG. 3 is a series of side sectional views of a piece of substrate material as a device is fabricated using a one-mask process.
Figure 3B:
Figure 3C:
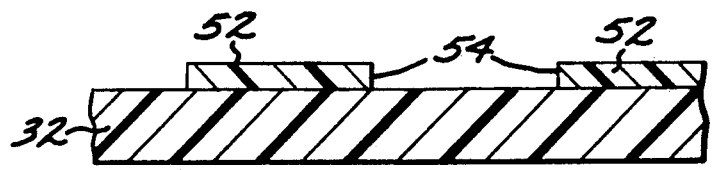
Figure 3D:
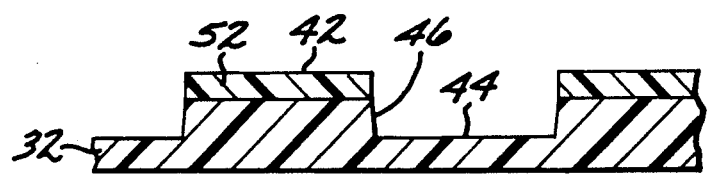

Referring to FIG. 3, a one-mask process, there is provided a substrate piece 32 of undoped semiconductor material with a generally flat back surface 34, FIG. 3a. A first layer 52 of mask material is deposited overlying the back surface 34, by any acceptable approach, FIG. 3b. The first layer 52 is preferably a glass that contains a material which is a dopant for the substrate piece 32. In the illustrated embodiment, the dopant is an element that is a p+ dopant for silicon, such as boron. The layer 52 could alternatively be prepared by other conventional doping techniques, such as gaseous doping and subsequent oxidation.

The first layer 52 is patterned with a series of parallel openings 54 therethrough, by conventional photolithography techniques known in the industry. Briefly, a layer of a photosensitive material is coated over the first layer 52 and then exposed and developed. The openings 54 are etched into the first layer 52 through the pattern in the photosensitive material, and then the photosensitive material is removed. An etchant, such as a wet chemical etch or a plasma etch, that attacks the substrate piece 32 is used to etch trenches 44 into the back surface 34 of the piece, FIG. 3d. The etching of the trenches 44 simultaneously forms the mesas 42 and the inclined elevational transitions 46 between them. Thus, the patterned first layer 52 with the openings 54 therethrough acts as a mask for etching the trenches 44. It is, however, self aligned in the sense that the success of the process is not dependent upon where the mask is placed relative to the piece 32.

Figure 3E:
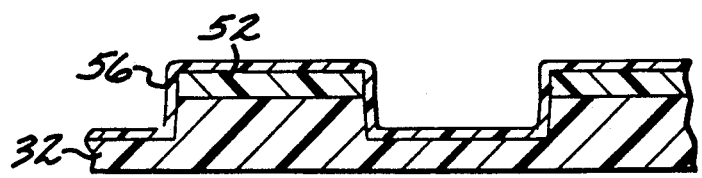

A second layer 56 of a dopant-containing material is deposited over the entirety of the back surface 34, overlying the remaining parts of the first layer 52 in some places and the parts of the substrate piece 32 in other places that were exposed during the etching step, FIG. 3e. The dopant in the second layer 56 is of the opposite type to the dopant in the first layer 52. That is, if the first layer 52 contains a p+ dopant for the substrate piece, as illustrated, then the second layer 56 contains an n+ dopant for the substrate piece. In the case of a silicon substrate, the preferred n+ dopant is phosphorus.

Figure 3F:
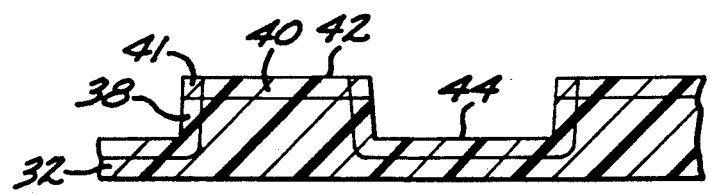

After the layers 52 and 56 are in place, the substrate piece 32 and layers 52 and 56 are heated to a high temperature to drive dopant atoms from the layers 52 and 56 into the respective adjacent regions of the piece 32, to form the p+ doped region 40 and the n+ doped region 38, FIG. 3f. The P/N junction 41 is found between the regions 38 and 40. After this "drive in" step, the first layer 52 and second layer 56 are removed chemically. Alternatively, the trench could be doped using any of the many conventional doping methods.

Figure 3G:
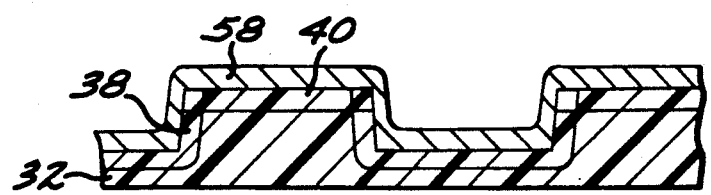

To form the electrodes 28 and 30, a metalization layer 58 is deposited over the back surface 34, FIG. 3g. This layer 58 is deposited generally, with no attempt to confine it to particular locations, as with a mask. However, due to the geometry of the surface, there is a natural variation in the thickness of the layer 58. The top of the mesa 42 and the bottom of the trench 44 are covered with a substantially uniformly thick layer of the metal. The inclined elevational transitions 46 have a thinner covering of the metal, as shown in FIG. 3g, because there is a greater surface area to be covered with the flux of metal atoms through a selected area perpendicular to the vector 48. The thickness of the layer 58 on the inclined area is expected to be approximately the thickness on the top of the mesa 42 times the cosine of the angle between the vectors 48 and 50. There is also typically observed a microcrack at the corner between the top of the mesa 42 and the inclined elevational transition 46.

Figure 3H:
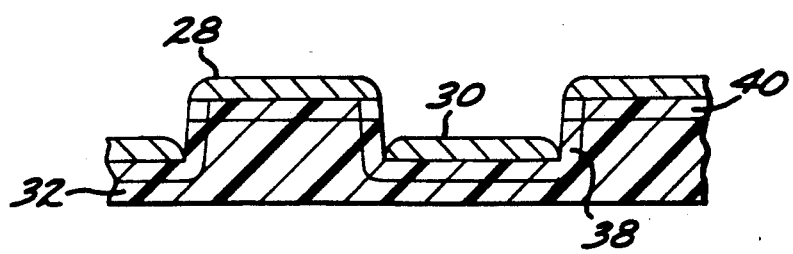

A portion of the thickness of the metalization layer 58 is next removed by etching, typically wet chemical or plasma etching. The etching is continued for a sufficient time that the thin portion of the layer 58 overlying the inclined elevational transition 46 is removed, breaking the lateral continuity of the layer 58, as illustrated in FIG. 3h. By this approach, separated positive electrodes 28 and negative electrodes 30 are formed, without the need for electrode definition using a mask. Moreover, the electrodes 28 and 30 are precisely aligned and positioned, due to their mode of formation. Significantly, the precise alignment is entirely defect tolerant. Independent of defects, all of the material on the upper level of the mesa is of one dopant type, and everything below the bottom of the trench and under the surface of the inclined elevational transition is of the other dopant type. Since all edges are free of the metalization, no shorts can occur.

All of the electrodes 28 are connected together and to an external circuit, and all of the electrodes 30 are separately connected together and to an external circuit. The solar cell 20 is ready for operation.

FIG. 4 illustrates a similar one-mask fabrication process, that has been altered to show three modifications that may be used together or separately. One process variation allows for the use of a substrate piece 32 that has been doped prior to use, a second permits the p+ region to be at the bottom of the trench rather than the top of the mesa, and the third provides an etch control layer that further improves the definition between the electrodes.

Figure 4A:
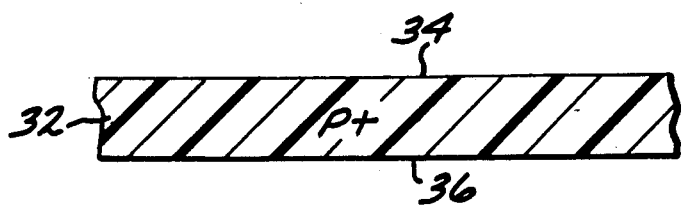
FIG. 4 is a series of side sectional views of a piece of substrate material as a device is fabricated by another embodiment of a one-mask process.
Figure 4B:
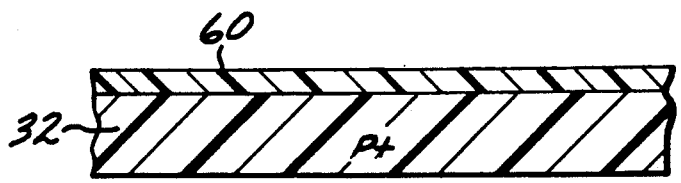
Figure 4C:
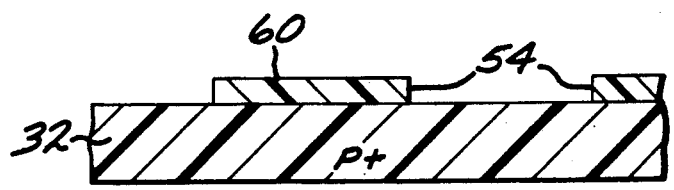
Figure 4D:
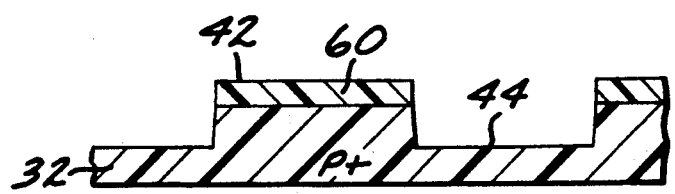

Referring to FIG. 4a, a substrate piece 32 is furnished as a p+ doped wafer of silicon. (The doping of the substrate could instead be n+, but is here presented as p+ to illustrate the alternative embodiment.) The piece 32 may be doped through its thickness, or only to a sufficient depth below the back surface 34 that a P/N junction can be subsequently formed. A layer 60 of n+ doped material such as glass is deposited overlying the back surface 34, FIG. 4b. The layer 60 is patterned and etched to define the pattern of openings 54, and the pattern is transferred to the substrate piece 32 by etching, as discussed in relation to the process of FIG. 3.

Figure 4E:
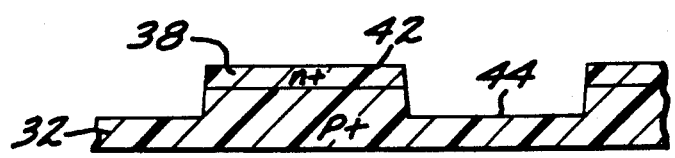
Figure 4F:
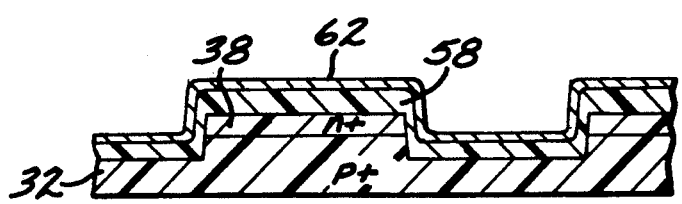
Figure 4G:
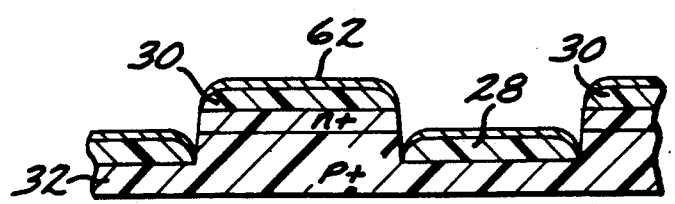

The n+ dopant is driven into the mesas by a heat treatment, and the layer 60 removed by etching, FIG. 4e. The metalization layer 58 is deposited overlying the back surface 34. An etch control layer 62, preferably titanium in a thickness of about 500 Angstroms, is deposited overlying the metalization layer 58. A portion of the metalization layer 58 is removed by etching to define the pattern of electrodes 28 and 30. However, the process of etching differs from that illustrated in FIG. 3 inasmuch as the etch control layer 62 prevents removal of any of the metalization layer 58 at the tops of the mesas and the bottoms of the trenches, so that the metalization remains thick in these regions. A thick metalization is desirable in reducing the series electrical resistance of the solar cell. It has been observed that the etch control layer 62 is not continuous, and contains pinholes, in the region of the inclined elevational transition 46. The etchant is able to penetrate through these pinholes and attack the underlying metalization, with the result that it is removed completely in the region 46 but with virtually no attack of the metalization in the regions of the mesas and trenches.

As indicated, the process variations discussed in relation to FIG. 4 may be used singly or together in relation to the process of FIG. 3.

A more efficient solar cell can be prepared using a slightly more complex two-mask procedure, illustrated in FIG. 5, rather than the one-mask procedure of FIGS. 3 and 4. Depending upon the use to be made of the solar cell, the increased efficiency of the two-mask cell may justify its increased cost.

The two-mask procedure of FIG. 5 is illustrated as a variation of the procedure of FIG. 3, but may be used in conjunction with the process variations of FIG. 4, to the extent they are compatible. Referring to FIG. 5, the steps producing the structures of FIGS. 5a–5f are identical to the respective steps producing the respective structures of FIGS. 3a–3f, and will not be repeated in detail.

Figure 5A:
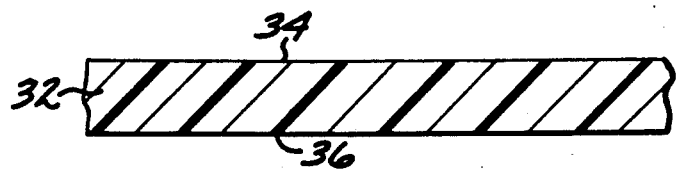
FIG. 5 is a series of side sectional views of a piece of substrate material as a device is fabricated by a two-mask process.
Figure 5B:
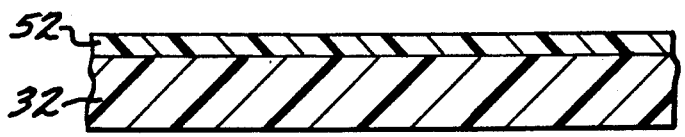
Figure 5C:
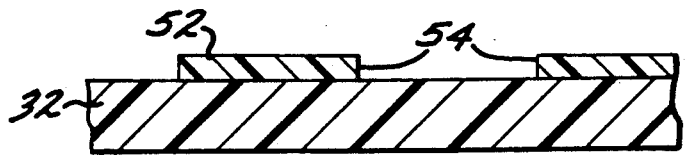
Figure 5D:
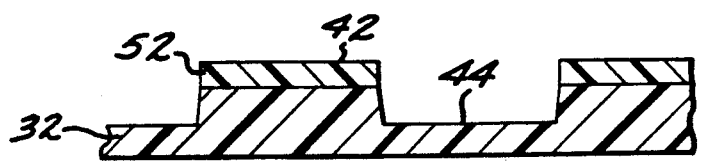
Figure 5E:
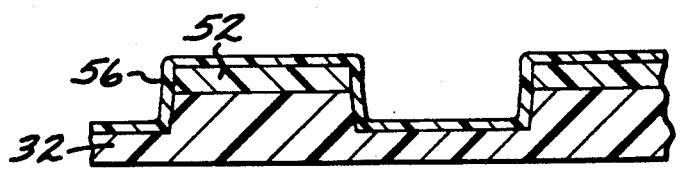
Figure 5F:
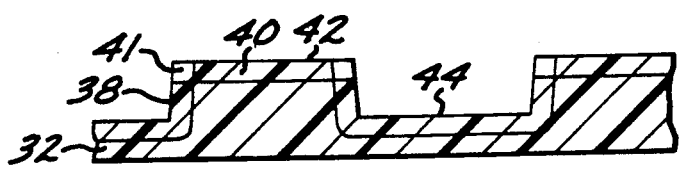
Figure 5G:
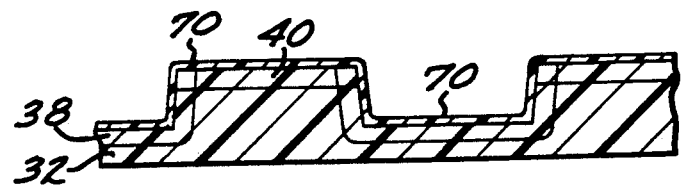
Figure 5H:
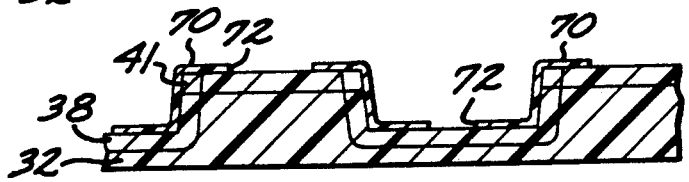

After the drive in of the dopants into the silicon substrate, FIG. 5f, the doped silicon substrate piece 32 is oxidized to produce a thin layer of silicon dioxide 70, preferably about 600 Angstroms thick. The presence of a silicon dioxide layer 70 is known to improve the efficiency of a solar cell, and the present processing technology is compatible with the use of this type of known process enhancement. The silicon dioxide layer 70 is patterned and etched using conventional masked photolithographic procedures to form openings 72 therethrough, which permit access to the doped silicon substrate piece, see FIG. 5h. The formation of these openings 72 thus requires a second mask, but the mask may be randomly placed and therefore does not require alignment.

Figure 5I:
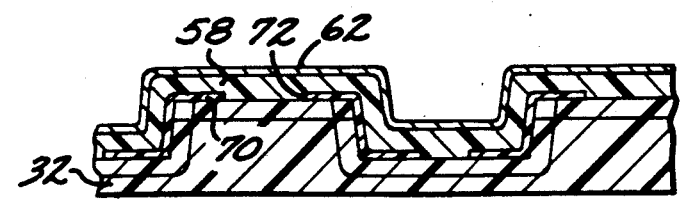
Figure 5J:
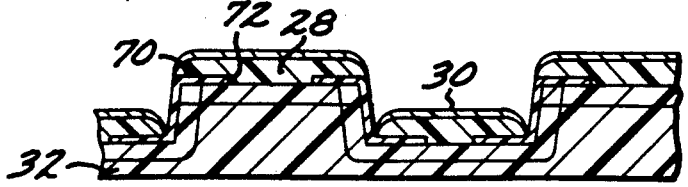

Following formation of the openings 72 in the silicon dioxide layer 70, the metalization is applied and etched, FIGS. 5i and 5j, in the same manner as illustrated in FIGS. 3g and 3h, respectively. Alternatively, the approach of FIGS. 4f-4g can be used.

Figure 6:
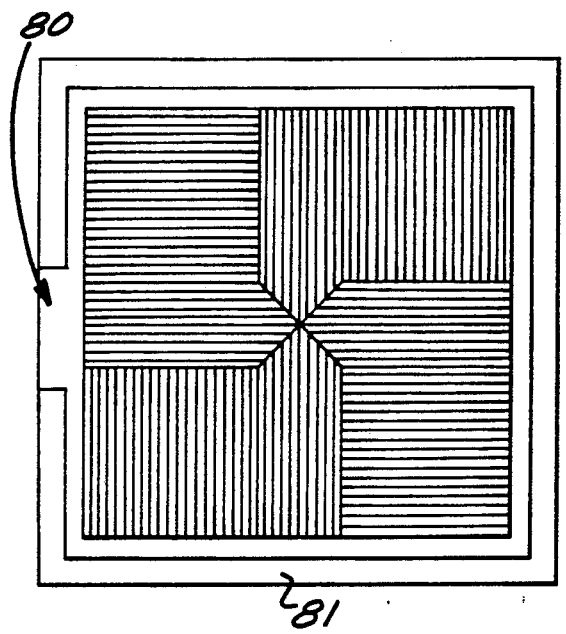
FIG. 6 is a schematic perspective back side view of a rectilinear/radial format device made in accordance with the invention.

FIG. 1 illustrates a solar cell with the electrodes 28 and 30 in a rectilinear array. The electrodes can be arranged in any other desired pattern. One such alternative pattern, that enhances the making of external electrical connections, is a rectilinear/radial array 80, as illustrated in FIG. 6. The trenches are arranged so that one end extends to the outer periphery of the array 80. In the pictured approach, some of the electrodes extend from the center of the array to the edge. Others extend from a location spaced from the center of the array to the edge, to achieve full coverage of the area while maintaining the spacing between like electrodes approximately constant and permitting one end of the trench electrode to extend to the periphery. All of the electrodes formed in the trenches of the bilevel array are brought to the outer edge of the array 80, and are connected to a common bus bar 81. The mesa electrodes are preferably externally connected by the approach described next.

Figure 7:
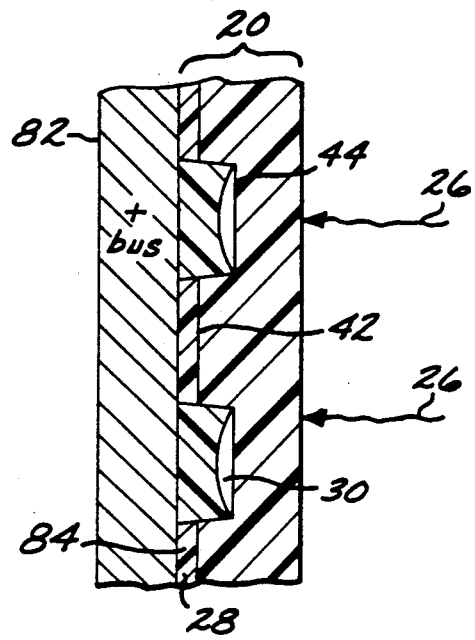
FIG. 7 is a side sectional view of the device of FIG. 6, taken generally along lines 7—7, illustrating an approach for forming the external connections to the mesas.

The use of a bilevel elevation array, with the electrodes of one sign on the tops of the mesas, permits a unique connection approach for those electrodes. As shown in FIG. 7, the solar cell is joined to a conducting bus bar/support 82 by soldering or similar technique. The support 82 is covered with solder, the solar cell 20 is placed, back side down, onto the solder, and the solder is melted to achieve the electrical contact. Electrical current from the mesa electrodes 28 is conducted directly into the bus bar/support 82, and thence to an external circuit. The making of this connection is enhanced by filling the trenches with an insulator 84 using conventional planarization techniques, or by depositing an insulator in the trenches and using a subsequent photolithographic technique to pattern it. The use of the massive bus bar/support 82 significantly reduces the series resistance of the solar cell by increasing the cross sectional dimension of the conductor.

The following examples are intended to illustrate embodiments of the invention, but should not be taken as limiting of the invention in any respect.

EXAMPLE 1

A procedure like that depicted in FIG. 5 is followed to prepare a two-mask cell for use in a light intensity of one-sun. The substrate piece 32 is preferably a circular silicon wafer that is about 130 micrometers thick and about 7.6 centimeters in diameter with a texturized front surface. The first layer 52 includes a sublayer of about 1000 Angstroms of a silicon glass deposited from the standard atmosphere of oxygen, nitrogen, phosphine, and silane, with a phosphine to silane ratio of 0.15, using a Tempress Model Pyrox 216 apparatus. Deposition is accomplished at 1 atmosphere total pressure and a temperature of 400° C. A cap sublayer of silicon dioxide about 4000 Angstroms thick is deposited overlying the phosphorus-doped glass. After deposition of the two sublayers, the substrate is heated to a temperature of 920° C. for 10 minutes to densify the glass. The patterning of the first layer 52 mask is accomplished using Shipley positive resist 1813, processed according to standard procedures. The mesa and trench pattern is that depicted in FIG. 6, with the mesas being 140 micrometers wide and the trenches being 60 micrometers wide. The trench 44 is etched into the silicon using a mixture of 80 parts by volume nitric acid and 1 part by volume hydrofluoric acid, at ambient temperature for about 5 minutes. The depth of the trench is about 3 micrometers.

The second layer 56 is 1000 Angstroms of a sublayer of silicon glass deposited from the standard atmosphere of oxygen, nitrogen, diborane, and silane, with a diborane to silane ratio of 0.07, and with an overlying sublayer of 2000 Angstroms of undoped glass deposited from a silane atmosphere. Deposition is at a total pressure of 1 atmosphere and a temperature of 400° C., and is accomplished with a Tempress Model Pyrox 216 apparatus. (Thus, in this case the mesa tops become doped $n+$ and the bottoms of the trenches become doped $p+$.) The drive in of phosphorus and boron into the substrate piece is accomplished by heating to a temperature of 1120° C. for a time of 30 minutes. The resulting $n+$ doping is about 6 ohms per square, and the $p+$ doping is about 26 ohms per square.

The layers 52 and 56 are removed by immersion in a solution of 1 part by volume hydrofluoric acid in 10 parts by volume water. A layer of phosphorus-doped glass about 600 Angstroms thick is deposited on the front side of the silicon substrate, using the chemical vapor deposition technique described above. In the subsequent heating, phosphorus diffuses into the front face of the cell to produce a light $n+$ doping of about 400-500 ohms per square. The exposed back surface of the silicon substrate is oxidized at a temperature of 1000° C. for 120 minutes, to produce a layer 70 of silicon dioxide about 600-1000 Angstroms thick. This layer 70 is patterned using Shipley positive resist 1813, and the pattern is transferred to the layer 70 using buffered oxide etch, to produce the openings 72.

The metalization layer 58 is aluminum-1 percent silicon deposited by vacuum sputter deposition to a thickness, on the top of the mesa, of about 2 micrometers. An etch control layer 62 of titanium is deposited by vacuum sputter deposition to a thickness of about 500 Angstroms. The metalization layer is partially removed, so as to completely remove the metal on the inclined elevational transitions, by immersion in KTI aluminum etch II (a mixture, in parts by volume, of 80 parts phosphoric acid, 10 parts acetic acid, 1 parts nitric acid, and 9 parts water) for a period of about 5 minutes. The titanium etch control layer is removed by immersion in a solution of 1 part by volume ammonium hydroxide, 1 part by volume hydrogen peroxide, and 5 parts by volume water for about 5 minutes. The substrate is then annealed at 350° C. for 10 minutes, in 1 atmosphere total pressure of a mixture of 10 percent hydrogen in nitrogen.

This procedure was used to fabricate four cells, each of size 10.5 square centimeters, on four different silicon substrates. All four fabrications were successfully accomplished.

EXAMPLE 2

The four cells fabricated in Example 1 were tested for operating characteristics at one sun light intensity. The measured conversion efficiencies were 21.9 percent, 21.7 percent, 21.1 percent, and 20.8 percent. The cell of conversion efficiency 21.9 percent had a high current density of 41.7 milliamps per square centimeter. This cell exhibited 1 microampere per square centimeter leakage current at −1 volt bias. By comparison, the best backside contact cell reported to date, made by a much more complex fabrication approach and optimized for performance, had a conversion efficiency of 22.3 percent and a current density of 40.6 milliamps per square centimeter. (See R. R. King, R. A. Sinton, and R. M. Swanson, "Front and Back Surface Fields for Point-Contact Solar Cells", *Proceedings of the 20th IEEE Photovoltaic Specialist Conference*, Las Vegas, Nev., September 1988.) Thus, the present cell using only two masking steps, with a resulting higher success rate in fabrication, provides comparable results to those of the most efficient cell made to date.

EXAMPLE 3

From the data measured for the 21.9 percent efficiency cell of Example 2, the efficiencies of that cell in concentrated sunlight were estimated using the approach of R. A. Sinton and R. M. Swanson, "Design Criteria for Si Point-Contact Concentrator Solar Cells", *Trans. Elec. Dev.* Vol. ED-34 No. 10, October 1987. The estimated efficiencies were 25 percent at 6 suns intensity, 28 percent at 70 suns intensity, and 29 percent at 200 suns intensity.

EXAMPLE 4

A single-mask device was prepared using the approach generally illustrated in FIG. 3. The procedures described in Example 1 above were followed, except that the 600–1000 Angstrom thick silicon dioxide layer 70 was not formed, and was not present to be patterned. The metalization was therefore deposited over the entire back surface directly in contact with the silicon substrate, rather than being in contact with a silicon dioxide layer 70 in some regions and the substrate in other regions through the patterning of silicon dioxide.

EXAMPLE 5

The output characteristics of the device of Example 4 was measured using an open circuit voltage decay technique. The parameter of most interest, the total emitter saturation current, was determined to be $4 \times 10^{-13}$ amperes per square centimeter.

EXAMPLE 6

The efficiency of the cell of Examples 4 and 5 was estimated using the technique reported in Example 3. The efficiency was estimated to be about 25 percent at 20 suns intensity and 28 percent at 200 suns intensity.

EXAMPLE 7

Twenty-five unoptimized solar cells were prepared using the approach generally described in relation to FIG. 4. The cells were prepared to evaluate fabrication techniques and yields, and did not have optimizing features such as front-side texturizing and diffusions.

The silicon substrate in each case was a wafer about 380 micrometers thick and 7.5 centimeters diameter. It was p+ doped with boron to a value of 0.1–0.9 ohm-centimeter. A layer of phosphorus-doped silicon glass about 1000 Angstroms thick, with undoped caps about 4000 Angstroms thick, was deposited and patterned, and 3 micrometer deep trenches were etched, using the procedure of Example 1. The n+ phosphorus dopant was driven into the surface and the glass removed using the procedure of Example 1. The metallization of aluminum-1 percent silicon was applied using the procedure of Example 1. Several different etch control layers 62 were tried on various of the cells. Layers of 500 Angstroms of titanium, 600 Angstroms of tungsten, and 500 Angstroms of silicon were applied on different cells. The metalization was then etched using the procedure of Example 1. All of the materials used in the various etch control layers were operable, with titanium and silicon being most effective. Tungsten had a tendency to have more pinholes than desired for even etching.

EXAMPLE 8

The bilevel design and fabrication approach can be used with other solar cell design philosophies, to reduce the fabrication complexity and increase yields. A solar cell was fabricated with backside mesa point contacts and trench line contacts, so that the p+ and n+ doped regions were well separated, but using the bilevel approach of the invention.

A silicon substrate about 280 microns thick and 7.5 centimeters diameters was oxidized on the back side for 4 hours at a temperture of 1120° C. to produce a layer of thermal silicon dioxide about 3600 Angstroms thick. The silicon dioxide was patterned with a series of 10–20 micrometer diameter openings therethrough, using Shipley 1813 to pattern and 6:1 buffered oxide etchant to transfer the pattern to the silicon dioxide. These openings were placed over the entire surface, and no pattern alignment was required.

The procedure of Example 1 was then followed to complete fabrication of the cell. The previously etched openings that fell where the trenches were etched disappeared during the etching, while the openings that fell upon the mesa tops were retained. The subsequent doping of the mesa tops occurred only through these openings, producing a point contact mesa doping pattern. The doping of the trenches is analogous to point doping of these regions but in fact produces doping along a line, because the doping is present only along the sides and at the bottom of the trenches.

Measurements of the performance of this cell indicated an expected efficiency between those of the cells measured in Examples 2 and 5.

Figure 8:
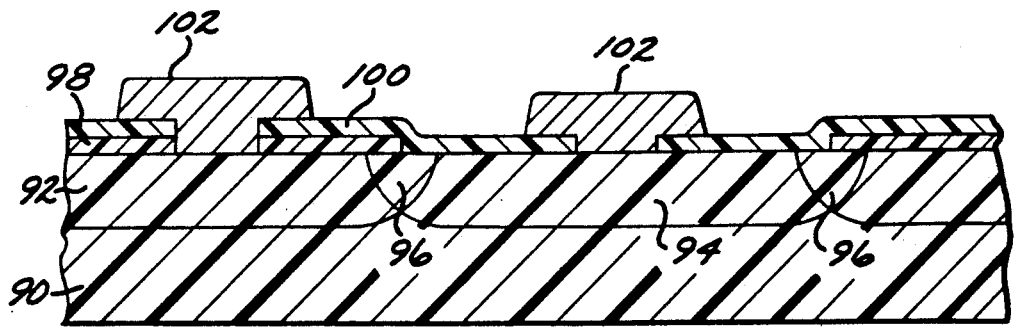
FIG. 8 is a side sectional view of a solar cell made using a single level, compensated semiconductor construction.

One of the important results of the present fabrication approach is that the presence of a compensated region does not adversely affect the performance of the solar cell in any serious way. The ability to tolerate a compensated region in a solar cell permits redused fabrication complexity in even conventional, single level cells (as well as the bilevel cells discussed previously), because of the reduced requirements of masking. FIG. 8 illustrates a single level solor cell having a compensated region. A substrate 90 includes a p+ doped region 92, an n+ doped region 94, and an overlapped compensated region 96. The presence of the compensated region 96 does not prevent efficient operation of the cell.

A cell such as that of FIG. 8 may be fabricated by depositing a doping layer 98, preferably a boron-containing glass, that covers a portion of the back side of the solar cell. Another doping layer 100, preferably a phosphorus-containing glass, is deposited thereover. The dopants are driven into the substrate 90 by an elevated temperature treatment. The two layers 98 and 100 are patterned with openings therethrough. A metal layer is deposited and the metalizations 102 and 102' patterned and etched, and the solar cell is ready for use. This fabrication procedures results in the compensated region 96 during the drive in step, as there is no effort made to separate the regions 92 and 94 so that no overlap can occur.

It has been found generally that the compensated region does not result in loss of solar cell effectiveness where both the p+ and n+ doped regions have more than about $10^{18}$ atoms per cubic centimeter, and the doping is asymmetric so that the n+ region is more heavily doped than the p+ doped region. The gradient between the concentration of dopant atoms in the n+ doped region and the concentration of dopant atoms in the p+ region should be kept small. In one example, the n+ doping is to about 6 ohms per square, and the p+ doping is to about 36 ohms per square. In another example, the concentration of dopant atoms in the n+ doped region is about $1-5\times10^{19}$ atoms per cubic centimeter, and the concentration of dopant atoms in the p+ doped region is about $0.5-2\times10^{19}$ atoms per cubic centermeter, always keeping the concentration of the n+ dopant greater than the concentration of the p+ dopant. The fabrication and doping steps are conducted in a very clean environment.

The composition gradient resulting from the approach just described is low, to avoid junction leakage. The preferred gradient is less than about $2-3\times10^{19}$ atoms per micrometer. Although particular embodiments of the invention have been described in detail for purposes of illustration, various modifications may be made without departing from the spirit and scope of the invention. Accordingly, the invention is not to be limited exceot as by the appended claims.

What is claimed is:

1. A solar cell, comprising:
   a body of a semiconductor material having at least one P/N junction therein, the body including
   a front face having no electrodes thereon, and
   a bilevel elevation back face having at least one P-doped region at a first level interdigitated with at least one N-doped region at a second level, wherein the at least one P-doped region and the at least one N-doped region partially overlap to form at least one compensated region; and
   a positive electrode contacting the at least one P-doped region and a negative electrode contacting the at least one N-doped region, both electrodes contacting the solar cell on the back face.

2. The solar cell of claim 1, wherein the semiconductor material is silicon.

3. The solar cell of claim 1, further including a flat plate bus bar/support fastened to the back face of the solar cell.

4. The solar cell of claim 1, wherein each electrode includes a matalization layer and an overlying etch control layer.

5. A process for preparing a solar cell, comprising the steps of:
   providing a body of a semiconductor material;
   forming laterally alternating mesas and trenches on a back face of the semiconductor body, there being an elevational transition region between each mesa and the adjacent trench;
   doping the back face of the semiconductor piece so that P/N junctions are formed between the material below the mesas and the material below the trenches;
   depositing a metalization layer overlying the back face of the semiconductor piece; and
   removing the portion of the metalization layer deposited upon the transition region between the mesas and trenches without applying a mask to effect the removal.

6. The process of claim 5 wherein the procedures used in the steps of forming and doping are intermixed.

7. The process of claim 5, including the additional step of:
   applying a mesa electrical connector to contact the tops of the mesas.

8. The process of claim 5, wherein the semiconductor material is silicon.

9. The process of claim 5, wherein the P/N junctions produced in the step of doping include compensated regions at the peripheral edges of the mesas containing both P-type dopant and N-type dopant.

10. A solar cell prepared by the process of claim 9.

11. A process for preparing a solar cell having back side positive and negative electrical connections, and no electrical connections on the front side of the solar cell, comprising the steps of:
    providing a body of a semiconductor material having a front face and a back face;
    placing a mask onto the back face, the mask having therein an interdigitated pattern of masked and unmasked regions;
    forming a pattern of trenches in the back face through the unmasked regions with mesas between the trenches and elevational transition regions between each mesa and the adjacent trench; and
    providing a metalization layer on the tops of the mesas and the bottoms of the trenches, but not in the elevational transition regions, the step of providing a metalization layer to occur without any photolithographic masking of the cell.

12. A process for preparing a solar cell, comprising the steps of:
    providing a body of a semiconductor material having a front face and a back face;
    depositing a layer of a mask material onto the back face, the mask material having a first dopant therein;
    patterning the mask to form a pattern of elongated openings therethrough;
    transferring the mask pattern to the back face of the body of semiconductor material to form a pattern of laterally adjacent mesas and trenches in the back face, the mesas and trenches being separated by regions inclined at an angle from the normal to the trench bottom;
    diffusing first dopant from the mask material into the mesas;
    removing the mask;
    depositing a metalization layer onto the back face; and
    etching the metalization layer by an amount sufficient to remove that portion overlying the inclined regions but not those portions overlying the mesas and the trenches.

13. The process of claim 12, including the additional step, after the step of diffusing first dopant but before the step of depositing a metalization layer, of:
    providing a second dopant to the portion of the semiconductor piece at the bottom of the trenches.

14. The process of claim 12, including the additional step, after the step of removing the mask and before the step of depositing a metalization layer, of:
    forming an oxide layer over a portion of the back face.

* * * * *